US006190828B1

(12) United States Patent
Verschueren et al.

(10) Patent No.: US 6,190,828 B1
(45) Date of Patent: Feb. 20, 2001

(54) METHOD FOR MAKING A LITHOGRAPHIC PRINTING MASTER

(75) Inventors: Eric Verschueren, Merksplas; Joan Vermeersch, Deinze, both of (BE)

(73) Assignee: Agfa-Gevaert, N.V., Mortsel (BE)

( * ) Notice: Under 35 U.S.C. 154(b), the term of this patent shall be extended for 0 days.

(21) Appl. No.: 09/552,313

(22) Filed: Apr. 19, 2000

Related U.S. Application Data

(60) Provisional application No. 60/132,167, filed on May 3, 1999.

(30) Foreign Application Priority Data

Apr. 27, 1999 (EP) ........................................ 99201315

(51) Int. Cl.[7] ........................ G03F 7/30; G03F 7/38; G03F 7/18; G03F 7/24

(52) U.S. Cl. .................... 430/258; 430/256; 430/302; 430/327; 430/329; 430/330; 430/348; 430/935; 430/964

(58) Field of Search ............................ 430/256, 258, 430/330, 348, 964, 200, 302, 327, 329, 935

(56) References Cited

U.S. PATENT DOCUMENTS

| | | | |
|---|---|---|---|
| 5,045,697 | 9/1991 | Schneider | 250/316.1 |
| 5,072,671 | 12/1991 | Schneider et al. | 101/467 |
| 5,601,022 | 2/1997 | Dauer et al. | 101/467 |

FOREIGN PATENT DOCUMENTS 0 770 495 5/1997 (EP) .

*Primary Examiner*—Richard L. Schilling
(74) *Attorney, Agent, or Firm*—Breiner & Breiner

(57) ABSTRACT

A method for making a lithographic printing master is disclosed. The method comprises a step of providing a hydrophilic cylindrical surface, e.g. an aluminium plate mounted on the plate cylinder of a printing press, with an image recording composition by transfer from a donor material. The donor material comprises a support and a transfer layer which comprises hydrophobic thermoplastic polymer particles dispersed in a hydrophilic binder and a compound capable of converting light to heat. The transfer is obtained by friction between the donor layer and the cylindrical surface and/or by moistening the cylindrical surface with an aqueous liquid. The method is especially suited for on-press coating and on-press imaging in computer-to-press procedures.

10 Claims, 1 Drawing Sheet

METHOD FOR MAKING A LITHOGRAPHIC PRINTING MASTER

Benefit is claimed under 35USC119(e) based on provisional Application Ser. No. 60/132,167 filed May 3, 1999.

FIELD OF THE INVENTION

The present invention relates to a method for making a lithographic printing master by on-press coating of an image recording composition.

BACKGROUND OF THE INVENTION

Rotary printing presses use a so-called master such as a printing plate which is mounted on a cylinder of the printing press. The master carries an image which is defined by the ink accepting areas of the printing surface and a print is obtained by applying ink to said surface and then transferring the ink from the master onto a substrate, which is typically a paper substrate. In conventional lithographic printing, ink as well as an aqueous fountain solution (also called dampening liquid) are supplied to the printing surface of the master, which is referred to herein as lithographic surface and consists of oleophilic (or hydrophobic, i.e. ink accepting, water repelling) areas as well as hydrophilic (or oleophobic, i.e. water accepting, ink repelling) areas.

Printing masters are generally obtained by the so-called computer-to-film method wherein various pre-press steps such as typeface selection, scanning, colour separation, screening, trapping, layout and imposition are accomplished digitally and each colour selection is transferred to graphic arts film using an image-setter. After processing, the film can be used as a mask for the exposure of an imaging material called plate precursor and after plate processing, a printing plate is obtained which can be used as a master.

In recent years the so-called computer-to-plate method has gained a lot of interest. This method, also called direct-to-plate method, bypasses the creation of film because the digital document is transferred directly to a plate precursor by means of a so-called plate-setter.

In the field of such computer-to-plate methods the following improvements are being studied presently:

(i) On-press imaging. A special type of a computer-to-plate process involves the exposure of a plate precursor while being mounted on a plate cylinder of a printing press by means of an image-setter that is integrated in the press. This method may be called 'computer-to-press' and printing presses with an integrated image-setter are sometimes called digital presses. A review of digital presses is given in the Proceedings of the Imaging Science & Technology's 1997 International Conference on Digital Printing Technologies (Non-Impact Printing 13). Computer-to-press methods have been described in e.g. EP-A 770 495, EP-A 770 496, WO 94001280, EP-A 580 394 and EP-A 774 364. Typical plate material used in computer-to-press methods are based on ablation. A problem associated with ablative plates is the generation of debris which is difficult to remove and may disturb the printing process or may contaminate the exposure optics of the integrated image-setter. Other methods require wet processing with chemicals which may damage or contaminate the electronics and optics of the integrated image-setter and other devices of the press.

(ii) On-press coating. Whereas a plate precursor normally consists of a sheet-like support and one or more functional coatings, computer-to-press methods have been described wherein a composition, which is capable to form a lithographic surface upon image-wise exposure and optional processing, is provided directly on the surface of a plate cylinder of the press. EP-A 101 266 describes the coating of a hydrophobic layer directly on the hydrophilic surface of a plate cylinder. After removal of the non-printing areas by ablation, a master is obtained. However, ablation should be avoided in computer-to-press methods, as discussed above. U.S. Pat. No. 5,713,287 describes a computer-to-press method wherein a so-called switchable polymer such as tetrahydro-pyranyl methylmethacrylate is applied directly on the surface of a plate cylinder. The switchable polymer is converted from a first water-sensitive property to an opposite water-sensitive property by image-wise exposure. The latter method requires a curing step and the polymers are quite expensive because they are thermally unstable and therefore difficult to synthesise.

(iii) Thermal imaging. Most of the computer-to-press methods referred to above use so-called thermal or heat-mode materials, i.e. plate precursors or on-press coatable compositions which comprise a compound that converts absorbed light into heat. The heat which is generated on image-wise exposure triggers a (physico-)chemical process, such as ablation, polymerisation, insolubilisation by cross-linking of a polymer, decomposition, or particle coagulation of a thermoplastic polymer latex. This heat-mode process then results in a lithographic surface consisting of ink accepting and ink repelling areas.

(iv) The development of functional coatings which require no wet processing or may be processed with plain water, ink or fountain is another major trend in plate making. Such materials are especially desired in computer-to-press methods so as to avoid damage or contamination of the optics and electronics of the integrated image-setter by contact with the processing liquids. WO 90002044, WO 91008108 and EP-A 580 394 disclose such plates, which are, however, all ablative plates having a multi-layer structure which makes them less suitable for on-press coating. A non-ablative plate which can be processed with plain water is described in e.g. EP-A 770 497 and EP-A 773 112. Such plates also allow on-press processing, either by wiping the exposed plate with water while being mounted on the press or by the ink or fountain solution applied during the first runs of the printing job.

A computer-to-press method that is characterised by most of the above advantages has been disclosed in EP-A 698 488. An oleophilic substance is image-wise transferred from a foil to a rotary press cylinder by melting said substance locally with a laser beam. The strip-shaped transfer foil has a narrow width compared to the cylinder and is translated along a path which is parallel to the axis of the cylinder while being held in close contact with the surface of the cylinder so as to build up a complete image on that surface gradually. As a result, this system is rather slow and requires a long downtime of the printing press, thereby reducing its productivity.

EP-A 802 547 describes an on-press coating method wherein an aqueous liquid, comprising a hydrophilic binder, a compound capable of converting light to heat and hydrophobic thermoplastic polymer particles, is coated on the plate cylinder so as to form a uniform, continuous layer thereon. Upon image-wise exposure, areas of the coated layer are converted into an hydrophobic phase, thereby defining the printing areas of the printing master. The press run can be started immediately after exposure without any additional treatment because the layer is processed by interaction with the fountain and ink that are supplied to the cylinder during the press run. So the wet chemical processing of these materials is 'hidden' to the user and accomplished during the first runs of the printing press. A problem associated with this method is that the wet coating step involves a risk of damaging or contaminating the optics and electronics of the integrated image-setter. In addition, the method produces an insufficient coating quality, characterised by a low consistency and a high frequency of coating artefacts. The quality of the wet-coating step can only be improved by installing a complex and sophisticated coating apparatus on the press.

OBJECTS OF THE INVENTION

It is an object of the present invention to provide a simple, consistent and high-quality on-press coating method for making a printing master which does not require a wet coating or processing step and which can be carried out at a sufficient speed so as to reduce downtime of the printing press. This object is realised by the method defined in claim 1. Specific features for preferred embodiments of the invention are disclosed in the dependent claims.

Further advantages and embodiments of the present invention will become apparent from the following description and drawings.

DETAILED DESCRIPTION OF THE INVENTION

Figure 1:
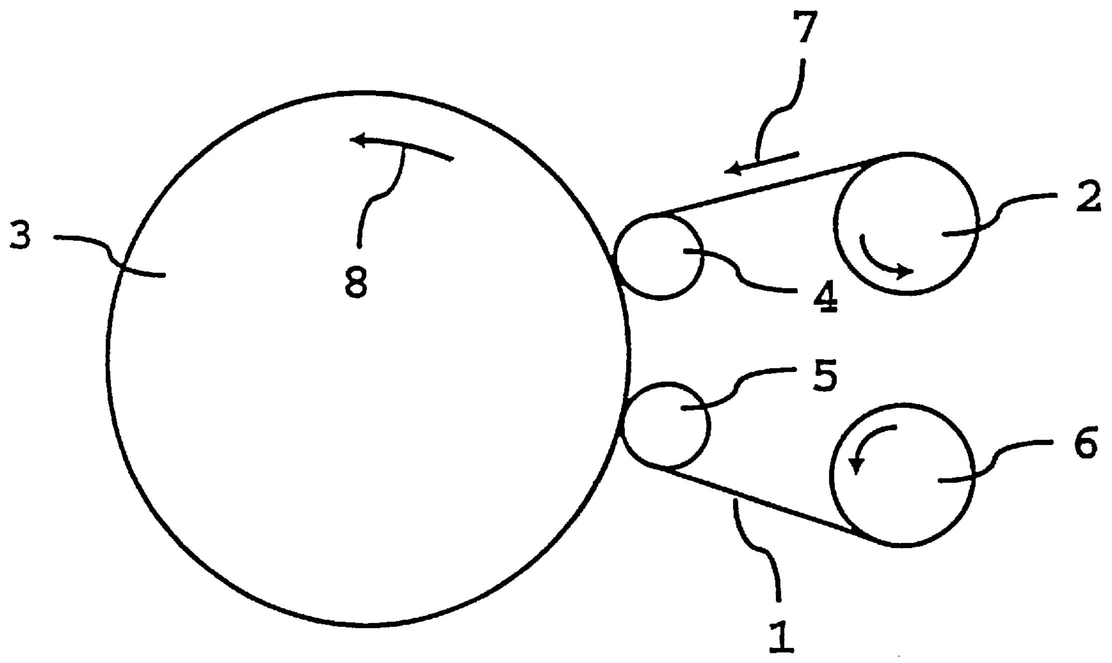
Fig. 1 shows a schematic illustration of a preferred embodiment according to the method of the present invention.

In the method for making a lithographic printing master according to the present invention, a donor material which comprises a support and a transfer layer is used to provide a hydrophilic cylindrical surface with an image recording layer. The term "cylindrical surface" may also be referred to herein simply as "cylinder". The transfer layer comprises an image recording composition which is transferred from the donor material to the cylinder so as to form a continuous image recording layer. More specifically the transfer layer of the donor material is brought into physical contact with the cylinder and the donor material is conveyed continually along the cylindrical surface, thereby transferring the image recording composition from the donor material to the cylindrical surface.

The image recording composition used in the methods of the present invention comprises hydrophobic thermoplastic polymer particles dispersed in a hydrophilic binder and a compound capable of converting light to heat. It was quite unexpected to find that this composition is capable of being transferred simply by friction. Such friction can be generated by conveying the donor material along the cylindrical surface at a speed which is not equal to the rotational speed of the cylinder. According to an alternative embodiment, said image recording composition can also be transferred by moistening the cylindrical surface with an aqueous solution and conveying the donor material along the cylindrical surface without generating friction, i.e. by conveying the donor material along the cylindrical surface at a speed which is equal to the rotational speed of the cylinder. According to still another method of the present invention, the image recording composition is transferred by pre-moistening the cylindrical surface with an aqueous solution as well as by friction, i.e. by conveying the donor material along the moistened cylindrical surface at a speed which is not equal to the rotational speed of the cylinder.

The method of the present invention is distinguished from the prior art method of EP-A 698 488, in that the image recording composition is not transferred image-wise by local heating but is coated so as to form a uniform, continuous layer over the whole printing surface of the printing master. Since the width of the donor material is preferably equal to the width of the printing master, a single revolution of the cylindrical surface is sufficient to provide the whole surface of the printing master with a coating, thereby effectively reducing the downtime of the press necessary for coating. If the thickness of the coated layer that is obtained after a single revolution is not sufficient, additional revolutions may be necessary to obtain the desired coating thickness. The image recording composition described herein is capable of forming a sufficient coating thickness after just a few revolutions.

After the coating step, the coated composition can be image-wise exposed to heat, thereby converting the exposed parts to hydrophobic, printing areas. Similar to the method described in EP-A 802 547, the unexposed parts are then removed during the first runs of the print job in a 'hidden' processing step by supplying fountain and/or ink. Since the cylindrical surface is a hydrophilic surface, the unexposed areas of the printing master are moistened during printing by the lithographic fountain solution. The hydrophobic exposed areas are ink accepting and define the printing areas of the printing master. In comparison with the wet-coating method of EP-A 802 547, the method of the present invention is simple, more convenient, and produces consistent results and less coating artefacts.

In addition to the advantages already mentioned, the method of the present invention is especially suited to be carried out on-press because a dry coating step is used and, consequently, there is no increased risk of damaging or contaminating electronic or optical devices that are integrated in the press, such as an image-setter of a digital press. Since the optional pre-moistening step and the processing step can be carried out by using regular fountain solution as an aqueous liquid, these steps neither prejudice the proper functioning of the electronic or optical devices of the press because during the press run such fountain liquids are supplied to the printing master anyhow.

According to a preferred method of the present invention, the image recording composition is transferred to the cylinder by friction. Said friction may be generated by conveying the donor material along the surface of the cylinder at a speed which is not equal to the rotational speed C of the cylinder. The speed may be different in absolute magnitude as well as in direction, i.e. the speed at which the web of donor material is conveyed along the surface of the cylinder may be higher or slower relative to the rotation of the cylinder and may be opposite or acting in the same direction as the movement of the cylinder. The term "not equal to C" also embraces the embodiment wherein the speed of the rotational movement of the cylinder and the speed at which the donor material is conveyed to the cylinder have an equal absolute magnitude but an opposite direction. C may also be equal to zero so that friction is generated by conveying the donor material along a stationary cylinder.

In the specific embodiment of FIG. 1, the donor material 1 is supplied to print cylinder 3 by unwinding a roller 2 of said material, contacting the material 1 with print cylinder 3 by contact rollers 4 and 5 and again winding the used material 1 on wind-up roller 6. In the manner known, the supply roller 2 and the wind-up roller 6 are driven by means of electronically controllable motors, so that during the conveying of the donor material 1 the strip tension can be kept constant. The transport direction and the rotational movement of the rollers 2 and 6 and print cylinder 3 are illustrated in FIG. 1 by arrows (vectors). In the preferred embodiment of FIG. 1, the donor material 1 is conveyed to the print cylinder 3 at a speed C (vector 7) which is higher than the relative movement of the cylinder 3 and into a direction that is opposite to the revolution thereof (vector 8). Of course, the transport of the donor material 1 can also occur in the other direction than shown in FIG. 1. All the rollers shown in FIG. 1 as well as the donor material 1 have substantially the same width (in the direction perpendicular to the plane of FIG. 1) so that the whole surface of the print cylinder is provided with a coating after a few revolutions. Provided that the speed of the donor material relative to the surface of the cylinder is sufficiently high, a single revolution suffices to obtain an adequate coating thickness.

Besides the embodiment of FIG. 1, other configurations to generate friction between the donor material and the cylindrical surface are of course possible. When only a single contact roller is used, a line-type contact between the donor material and the cylindrical surface is obtained instead of the sectional contact of FIG. 1.

The cylinder referred to above may be a plate cylinder of a rotary printing press, i.e. the transfer step can be carried out directly in the printing press. Alternatively, the image recording composition may be transferred to a cylinder in a dedicated apparatus for coating a layer according to the method of the present invention and that cylinder may then be transported into a printing press either manually or automatically by a mechanism that couples said dedicated coating apparatus to the printing press. This method enables to reduce to downtime of the press even more since the coating and even the exposure step can be carried out off-press while another print job is still running. After the press run, the printing master(s) are exchanged and a new print job can be started immediately.

According to a preferred embodiment, the press cylinder is not directly coated with the image recording composition but a hydrophilic base material is mounted onto said press cylinder and the surface of that base material is coated with the image recording composition instead. The base material can be e.g. a cylindrical seamless sleeve or a sheet that can be clamped around a press cylinder. The base material can be e.g. a hydrophilic metal plate or a plastic sheet which has been provided with a hydrophilic layer.

A highly preferred base material is an electrochemically grained and anodised aluminium plate. The anodised aluminium may be treated to improve the hydrophilic properties of its surface. For example, the aluminium support may be silicated by treating its surface with sodium silicate solution at elevated temperature, e.g. 95° C. Alternatively, a phosphate treatment may be applied which involves treating the aluminium oxide surface with a phosphate solution that may further contain an inorganic fluoride. Further, the aluminium oxide surface may be rinsed with a citric acid or citrate solution. This treatment may be carried out at room temperature or can be carried out at a slightly elevated temperature of about 30 to 50° C. A further interesting treatment involves rinsing the aluminium oxide surface with a bicarbonate solution. It is further evident that one or more of these post treatments may be carried out alone or in combination.

Plastic materials which can be used as a base material are e.g. poly(ethylene terephthalate) or poly(ethylene naphthalate). These materials are preferably provided with a cross-lined hydrophilic layer. A particularly suitable cross-linked hydrophilic layer may be obtained from a hydrophilic binder treated with a cross-linking agent such as formaldehyde, glyoxal, polyisocyanate or a hydrolysed tetra-alkylorthosilicate. The latter is particularly preferred. As hydrophilic binder there may be used hydrophilic (co) polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolysed to at least an extent of 60 percent by weight, preferably 80 percent by weight. The amount of crosslinking agent, in particular of tetra-alkyl orthosilicate, is preferably at least 0.2 parts by weight per part by weight of hydrophilic binder, preferably between 0.5 and 5 parts by weight, more preferably between 1.0 parts by weight and 3 parts by weight.

The cross-linked hydrophilic layer of the base material preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of the cross-linked hydrophilic layer of the base material may vary in the range of 0.2 to 25 μm and is preferably 1 to 10 μm. Particular examples of suitable cross-linked hydrophilic layers for use in accordance with the present invention are disclosed in EP-A 601240, GB-P-1419512, FR-P-2300354, U.S. Pat. No 3,971,660, U.S. Pat. No. 4,284,705 and EP-A 514490.

The donor material comprises a support and a transfer layer which comprises the image recording composition. Optionally, there may be provided one or more intermediate layers between the support and the image recording layer.

The support of the donor material may be a metal foil, paper or a plastic film such as a poly(ethylene terephthalate) film, cellulose acetate film, polystyrene film, polycarbonate film etc. The plastic film support may be opaque or transparent. It is particularly preferred to use a polyester film support.

The transfer layer of the donor material comprises a hydrophilic binder, for example synthetic homo or copolymers such as a poly(vinyl alcohol), a poly(meth)acrylic acid, a poly(meth)acrylamide, a poly(hydroxyethyl(meth) acrylate), a polyvinylmethylether or natural binders such as gelatine, a polysacharide such as e.g. dextran, pullulan, cellulose, arabic gum, alginic acid.

The transfer layer of the donor material also comprises hydrophobic thermoplastic polymer particles, preferably having a coagulation temperature above 35°C and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. When said polymer particles are subjected to a temperature above coagulation temperature they coagulate to form a hydrophobic agglomerate in the hydrophilic layer so that at these parts the hydrophilic layer becomes insoluble in plain water or an aqueous liquid. Specific examples of hydrophobic polymer particles for use in connection with the present invention are e.g. polyethylene, polystyrene, poly(vinyl chloride), poly (methyl (meth)acrylate), poly(ethyl (meth)acrylate), poly (vinylidene chloride), polyacrylonitrile, poly(vinyl carbazole) etc. or copolymers thereof. Most preferably used is polystyrene. The weight average molecular weight of the polymers may range from 5,000 to 1,000,000 g/mol. The hydrophobic particles may have a particle size from 0.01 $\mu$m to 50 $\mu$m, more preferably between 0.05 $\mu$m and 10 $\mu$m and most preferably between 50 nm and 80 nm. The amount of hydrophobic thermoplastic polymer particles contained in the image recording layer is preferably between 20 and 95 wt. %, more preferably between 40 and 95% wt. % and most preferably between 70 and 90 wt. %.

The polymer particles are present as a dispersion in the aqueous coating liquid of the image forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions.

The transfer layer of the donor material may also contain other ingredients such as surfactants which can be anionic, cationic, non-ionic or amphoteric. Perfluoro surfactants are preferred. Particularly preferred are non-ionic perfluoro surfactants. Said surfactants can be used alone or preferably in combination.

In accordance with a preferred method of the present invention, the imaging element is preferably image-wise exposed in heat mode by scanning with a laser or L.E.D. It is highly preferred to use a laser emitting in the infrared (IR), more particularly the near-infrared, i.e. emitting in the wavelength range 700–1500 nm. Near-infrared semiconductor (diode) lasers are especially preferred.

After image-wise exposure, the image recording layer is preferably processed by starting the print job. In a preferred embodiment, the dampener rollers that supply fountain solution are first dropped on the cylinder, which has been coated with the image recording composition and, subsequently, the ink rollers are dropped. Generally, after about 10 revolutions of the cylinder the first clear and useful prints are obtained.

With regard to dampening liquids useful in the present invention, there is no particular limitation and the known commercially available dampening liquids can be used. Suitable dampening liquids are aqueous liquids generally having an acidic pH and comprising an alcohol such as isopropanol.

In addition to the pre-moistening step, the transfer step, the exposure step and the hidden processing step described above, additional steps can optionally be included in the method of the present invention. Before the coating by transfer, the surface of the cylinder may be cleaned by the known manual or automatic procedures such as rubbing with a cloth, a cotton pad or a brush, air blowing, vacuuming, rinsing with a liquid by spraying or coating, or by using cleaning rollers, e.g. the devices known in the art for cleaning the blanket cylinder of an offset press. In addition, a primer layer may be applied on the surface of the cylinder before coating the image recording composition. Said primer layer may be used to improve the adhesion of the image recording composition or to improve the hydrophilic character of the surface.

EXAMPLES

Example 1

Preparation of the base material

A 0.20 mm thick aluminium plate was degreased by immersion in an aqueous solution of 5 g/l of sodium hydroxide at 50° C. and subsequently rinsed with demineralised water. The plate was then electrochemically grained using an alternating current in an aqueous solution containing 4 g/l of hydrochloric acid, 4 g/l of hydroboric acid and 5 g/l of aluminium ions at a temperature of 35° C. and a current density of 1200 $A/m^2$ so as to obtain a surface topography having an average center-line roughness (Ra) of 0.5 $\mu$m. After rinsing with demineralised water, the aluminium plate was etched with an aqueous solution of 300 g/l of sulphuric acid at 60° C. during 180 seconds and subsequently rinsed with demineralised water at 25° C. during 30 seconds. The plate was then subjected to anodic oxidation in an aqueous solution of 200 g/l of sulphuric acid at 45° C., a voltage of about 10 V and a current density of 150 $A/m^2$ during 300 seconds so as to form an anodic oxidation film of 3.0 $g/m^2$ of aluminium oxide. Finally, the plate was rinsed with demineralised water, post-treated with a solution containing a polyvinylphosphonic acid and aluminium trichloride, rinsed with demineralised water at 20° C. during 120 seconds and dried.

Preparation of the donor material

To 7.5 g of a 20 wt. % dispersion of polystyrene (particle diameter of 60 nm) stabilised with a surfactant (1.5 wt. % vs. polymer) in deionised water was added 20 g of a 1 wt. % solution of the following compound:

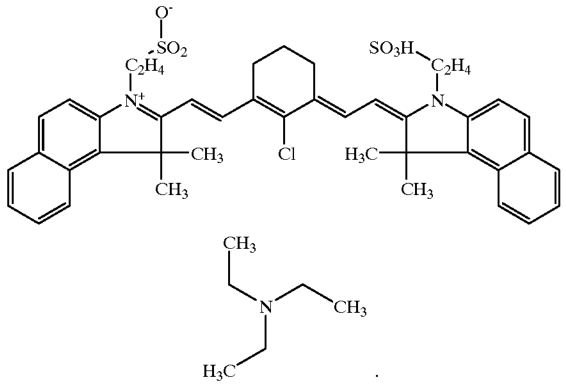

To the above obtained solution was added 66.5 g deionised water and 6 g of a 5 wt. % solution of CARBOPOL WS801 (a polyacrilic acid, commercially available from Goodrich). The solution thus obtained was coated at a wet thickness of 60 $\mu$m on a polyester foil having a thickness of 100 $\mu$m and then dried at 60° C. for at least 5 min.

Preparation of the printing master

The above mentioned base material was mounted on the plate cylinder of a Heidelberg GTO46 offset printing press, which was provided with a device for friction-induced transfer as illustrated in FIG. 1, with the proviso that just a single contact roller was present, thereby obtaining a line-type contact between the donor material and the base material. The donor material was conveyed along the plate cylinder in the same direction as the rotation of the cylinder but at a reduced speed of 80% of the press speed (3400 prints/hour), while applying a pressure on the contact roller of 3 bar. After one run of the press, the contact was disrupted.

Subsequently the printing member was image-wise exposed using an IR-diode laser having a wavelength of 830 nm and a power of 400 mJ/cm$^2$. Processing was achieved by applying the dampening rollers during 5 revolutions and then starting the inking system. From the first prints, a very good print quality was obtained. A run length of 10 000 copies was obtained without any loss of print quality.

Example 2

The same base material, donor material and printing press was used as described in Example 1. However before contacting the donor material and the base material, the latter was moistened with the dampening system of the press by applying the dampening system during 3 revolution. In this example, the pressure on the contact roller was reduced to 0.6 bar. After 1 revolution, the transferred image recording layer was allowed to dry at ambient conditions of temperature and humidity. Finally the same imaging, processing and printing procedure was applied with comparable results as in Example 1.

Example 3

The same base material, donor material and printing press was used as described in Example 1. In this example, the plate cylinder was additionally equipped with a freely driving adhesive cleaning roller, i.e. a Teknek cleaning head CH2, commercially available from Teknek LLC (USA). Before contacting the donor material and the base material, the press was run during 10 revolutions while the adhesion roller was in contact with the base material. After this cleaning step, the same exposure and processing procedure as described in Example 1 was used. The lithographic quality of the prints is very comparable to these obtained in Example 1 and 2. However the pre-cleaning step reduced the number of point defects, caused by dust that is adhered to the receiving material, to almost zero.

Example 4

The same base material, donor material and printing press was used as described in Example 1. In this example, the plate cylinder was additionally equipped with a freely running rubber cleaning roller (Shore hardness 40), which was covered with a lint-free absorbing Hyton cover, available from Veratec USA. Before contacting the donor material and the base material, the press was run during 10 revolutions, wetting the plate by applying the dampening system and realising a contact between the covered rubber roller and the base material. Afterwards, the covered rubber roller was tilted away from the base material. After this cleaning step, the same exposure and processing procedure as described in Example 1 was used. The lithographic quality of the prints is very comparable to these obtained in Example 1 and 2. However the pre-cleaning step reduced the number of point defects, caused by dust that is adhered to the receiving material, to almost zero.

What is claimed is:

1. A method for making a lithographic printing master wherein a hydrophilic cylindrical surface is provided with a continuous image recording layer by the steps of bringing a donor material comprising a support and a layer which contains an image recording composition into physical contact with the cylindrical surface, and conveying the donor material along the cylindrical surface, thereby obtaining a transfer of the image recording composition from the donor material to the cylindrical surface, wherein the image recording composition comprises hydrophobic thermoplastic polymer particles dispersed in a hydrophilic binder and a compound capable of converting light into heat.

2. A method according to claim 1 wherein the transfer of the image recording composition is obtained by friction, said friction being generated by rotating the cylindrical surface at a speed C, which may be zero, and conveying the donor material along the cylindrical surface at a speed which is not equal to C.

3. Method according to claim 1 wherein the cylindrical surface is moistened with an aqueous liquid before bringing the donor material into physical contact with the cylindrical surface.

4. Method according to claim 1 wherein the cylindrical surface is cleaned before bringing the donor material into physical contact with the cylindrical surface.

5. Method according to claim 1 wherein the donor material is a web-shaped material which is conveyed along the cylindrical surface by unwinding the donor material from a supply roller and, after the physical contact with the cylindrical surface, winding-up the donor material on a take-up roller.

6. Method according to claim 1 wherein the cylindrical surface is the surface of a hydrophilic base material which is mounted on a cylinder of a rotary printing press.

7. Method according to claim 1 wherein the width of the donor material is substantially equal to the width of the lithographic printing master.

8. Method for making a lithographic printing master comprising the steps of (i) providing a hydrophilic cylindrical surface with a continuous image recording layer according to claim 1;

(ii) image-wise exposing the image recording layer;

(iii) removing the unexposed areas of the image recording layer by supplying fountain or ink to the cylindrical surface.

9. Method according to claim 8 wherein the image recording layer is exposed by means of an infrared laser.

10. Method according to claim 8 or 9 wherein steps (i), (ii) and (iii) are carried out in a rotary printing press comprising an integrated laser image-setter.

* * * * *